US009620213B2

(12) United States Patent
Tran et al.

(10) Patent No.: US 9,620,213 B2
(45) Date of Patent: Apr. 11, 2017

(54) METHOD AND SYSTEM FOR RECONFIGURABLE PARALLEL LOOKUPS USING MULTIPLE SHARED MEMORIES

(71) Applicant: CAVIUM, INC., San Jose, CA (US)

(72) Inventors: Anh T. Tran, Santa Clara, CA (US);
Gerald Schmidt, San Jose, CA (US);
Tsahi Daniel, Palo Alto, CA (US);
Saurabh Shrivastava, Saratoga, CA (US)

(73) Assignee: Cavium, Inc., San Jose, CA (US)

( * ) Notice: Subject to any disclaimer, the term of this patent is extended or adjusted under 35 U.S.C. 154(b) by 128 days.

(21) Appl. No.: 14/142,511

(22) Filed: Dec. 27, 2013

(65) Prior Publication Data

US 2015/0187419 A1 Jul. 2, 2015

(51) Int. Cl.
G06F 13/00 (2006.01)
G11C 15/04 (2006.01)
H03K 19/177 (2006.01)
H04L 12/741 (2013.01)
G06F 12/0864 (2016.01)
H04L 12/743 (2013.01)

(52) U.S. Cl.
CPC ....... *G11C 15/04* (2013.01); *H03K 19/17728* (2013.01); *H04L 45/745* (2013.01); *G06F 12/0864* (2013.01); *H04L 45/7453* (2013.01)

(58) Field of Classification Search
CPC .................................................. G06F 12/0864
See application file for complete search history.

(56) References Cited

U.S. PATENT DOCUMENTS

| 4,929,939 | A | 5/1990 | Varma |
| 5,319,347 | A | 6/1994 | McClure |
| 6,667,984 | B1 | 12/2003 | Chao et al. |
| 7,461,167 | B1 | 12/2008 | Park |
| 8,054,744 | B1 | 11/2011 | Bishara et al. |
| 9,159,420 | B1 * | 10/2015 | Wohlgemuth ......... G11C 15/00 |
| 2002/0009076 | A1 | 1/2002 | Engbersen |
| 2005/0076228 | A1 | 4/2005 | Davis |

(Continued)

FOREIGN PATENT DOCUMENTS

EP            1553738 A1    7/2005

OTHER PUBLICATIONS

Altera, "White Paper" Jul. 2006, pp. 1-9.

(Continued)

*Primary Examiner* — Yong Choe
(74) *Attorney, Agent, or Firm* — Haverstock & Owens LLP

(57) ABSTRACT

Embodiments of the present invention relate to multiple parallel lookups using a pool of shared memories by proper configuration of interconnection networks. The number of shared memories reserved for each lookup is reconfigurable based on the memory capacity needed by that lookup. The shared memories are grouped into homogeneous tiles. Each lookup is allocated a set of tiles based on the memory capacity needed by that lookup. The tiles allocated for each lookup do not overlap with other lookups such that all lookups can be performed in parallel without collision. Each lookup is reconfigurable to be either hash-based or direct-access. The interconnection networks are programmed based on how the tiles are allocated for each lookup.

15 Claims, 11 Drawing Sheets

(56) References Cited

U.S. PATENT DOCUMENTS

| | | |
|---|---|---|
| 2006/0059269 A1 | 3/2006 | Chen et al. |
| 2013/0163475 A1 | 6/2013 | Beliveau |
| 2014/0153443 A1 | 6/2014 | Carter |
| 2014/0241353 A1 | 8/2014 | Zhang |
| 2015/0156288 A1 | 6/2015 | Lu |

OTHER PUBLICATIONS

Bosshart, Pat, "Forwarding Metamorphis: Fast Programmable Match-Action Processing in Hardware for SDN", Aug. 12, 2013, ACM, pp. 99-109.

Price, Charles, "MIPS IV Instruction Set", Sep. 1995, MIPS, pp. A-28-A-29 & A-105-A-106.

* cited by examiner

US 9,620,213 B2

METHOD AND SYSTEM FOR RECONFIGURABLE PARALLEL LOOKUPS USING MULTIPLE SHARED MEMORIES

FIELD OF INVENTION

The present invention relates to multiple parallel lookups using a pool of shared memories. More particularly, the present invention relates to method and system for reconfigurable parallel lookups using multiple shared memories.

BACKGROUND OF THE INVENTION

In a network processor, there are numerous applications that require fast lookups such as per-flow state management, IP lookup and packet classification. Several techniques can be used to implement lookup systems such as TCAM-based, hash-based and direct-access lookups. Hash-bashed lookup techniques and direct-access lookup techniques have lower memory cost and are faster than TCAM-based lookup techniques. State-of-the-art hash-based lookup techniques are based on a D-LEFT hash lookup scheme because of its high efficiency in using memories. However, in lookup systems of the prior art using these lookup techniques, the number of memories used for each lookup is fixed. This inflexibility prohibits any change to the memory capacity of each lookup after the systems are manufactured. In addition, lookup systems of the prior art cannot be changed from one lookup technique, such as hash-based, to another lookup technique, such as direct-access, to achieve 100% memory utilization, which can be useful in applications including exact-match lookup.

BRIEF SUMMARY OF THE INVENTION

A system on-chip supports multiple parallel lookups that share a pool of memories. The number of memories reserved for each lookup is reconfigurable based on the memory capacity needed by that lookup. In addition, each lookup can be configured to perform as a hash-based lookup or direct-access lookup. The shared memories are grouped into homogeneous tiles. Each lookup is allocated a set of tiles. The tiles in the set are not shared with other sets such that all lookups are able to be performed in parallel without collision. The system also includes reconfigurable connection networks which are programmed based on how the tiles are allocated for each lookup.

In one aspect, a system on-chip configured to support N parallel lookups using a pool of shared memories is provided. The system on-chip includes T×M shared memories are grouped into T tiles, M index converters for each lookup path, a central reconfigurable interconnect fabric for connecting N input ports to the T tiles, an output reconfigurable interconnect fabric for connecting the T tiles to N output ports, and N output result collectors. Each of the N output result collectors is per one lookup path.

In some embodiments, the T tiles are partitioned and allocated for lookup paths based on memory capacity needed by each of the lookup paths. A number of tiles allocated for each lookup path is a power of 2. A tile cannot overlap among partitions.

In some embodiments, each of the T tiles includes M memories for supporting D-LEFT lookups with M ways per lookup, a matching block for comparing pre-programmed keys in the M memories with an input key, and a selection block for selecting a hit result for that tile.

In some embodiments, each of the shared memories has $2^m$ entries. Each of the entries contains P pairs of programmable {key, data} for supporting D-LEFT lookups with P buckets per way.

In some embodiments, each lookup path is configurable to be a hash-based lookup or a direct-access lookup.

In some embodiments, index converter i of M index converters of each lookup path is used to access memory i in one of the T tiles allocated for that lookup path.

In some embodiments, each of M index converters of each lookup path is configurable based on a number of tiles allocated for that lookup path.

In some embodiments, each of M index converters of each lookup path further includes $\log_2(T)+1$ hash functions and $\log_2(T)+1$ non-hash functions, wherein outputs of the functions have bitwidths ranging from m bits to $\log_2(T)+m$ bits, a first configurable register for selecting one of the functions, and a second configurable register for selecting a tile offset such that a lookup index points to a correct tile among allocated tiles of that lookup path, wherein the allocated tiles are selected from the T tiles.

In some embodiments, an output index of each of the M index converters has $\log_2(T)+m$ bits. The $\log_2(T)$ most significant bits in the output index are used to point to one of the T tiles and the m last significant bits in the output index are used as a memory read address.

In some embodiments, the central reconfigurable interconnect fabric includes M configurable N×T networks. Each of the N×T networks can be a crossbar or a configurable butterfly.

In some embodiments, the output reconfigurable interconnect fabric includes T configurable 1×N de-multiplexors.

In some embodiments, one of N output result collectors associated with a lookup path is configured to collect results from allocated tiles for the lookup path and is configured to select one final result from results outputted by the allocated tiles.

In some embodiments, a hit result for each of the T tiles is based on key matching results between pre-programmed keys in memories of that tile and an input key of that tile.

In another aspect, a method of performing N parallel lookups using a pool of shared memories is provided. The method includes partitioning T tiles to N groups. Each of the T tiles includes M memories. Each of N lookup paths is associated with an input port and an output port. Each of N lookup paths is assigned to one of the N groups. The method also includes executing the N parallel lookups.

The execution of the N parallel lookups includes for each of N input keys (1) converting the input key into a plurality of lookup indexes, wherein each of the plurality of lookup indexes includes a Tile ID of a particular tile in one of the N groups that is to be accessed by a respective lookup path and also includes a memory address of a memory in the particular tile from which data will be read, (2) determining by using a collection of match information from the particular tile which hit information to return, and (3) determining by using a collection of hit information from those tiles indicated by the plurality of lookup indexes which final lookup result to return for a lookup path associated with the input key.

In some embodiments, in the determination of which hit information to return from the particular tile, a highest priority is given to a memory in that particular tile having a lowest Mem ID among all memories in that particular tile. In some embodiments, the hit information includes hit data and location of the hit data corresponding to a matched key.

The location of the hit data includes of a Mem ID, an address of a memory associated with the Mem ID, and location of the hit data in the memory.

In some embodiments, in the determination of which final lookup result to return for a lookup path, a highest priority is given to a tile having a lowest Tile ID among all tiles allocated for the lookup path. In some embodiments, the final lookup result includes hit data, a Tile ID of a tile containing the hit data, memory ID and memory address where the hit data is read.

In some embodiments, the method also includes, prior to executing the N parallel lookups, computing hash size for each lookup path, generating configuration bits for hash selection and tile offset for each lookup path, configuring networks connecting lookup paths and the tiles. and programming the memories for each lookup path. In some embodiments, a technique for programming the memories for each lookup path is based on a D-LEFT lookup technique with M ways and P buckets.

In yet another aspect, a converting device configured to support N parallel key-to-lookup indexes conversions is provided. The converting device includes N keys received at the converter. Each of the N keys is associated with a group of tiles from T tiles. Each of the T tiles includes M memories.

The converting device also includes N×M lookup indexes to return from the converter after parallel conversions of the N keys to the N×M lookup indexes.

The converting device also includes N×M converters. Each of the N×M converters is configured to convert a key from the N keys to a lookup index from the N×M lookup indexes. Each of the N×M converters includes $\log_2(T)+1$ hash functions and $\log_2(T)+1$ non-hash functions, wherein outputs of the functions have bitwidths ranging from m bits to $\log_2(T)+m$ bits, a first configurable register for selecting one of the functions, and a second configurable register for selecting a tile offset such that the lookup index points to a correct tile from the group of tiles associated with the key.

In some embodiments, the N×M lookup indexes are forwarded to a central reconfiguration interconnection fabric. The central reconfiguration interconnection fabric is configured to connect each of the N×M lookup indexes to one of T tiles for comparing the key with pre-programmed keys stored in that tile.

In yet another aspect, a tile device is provided. The tile device includes M memories. Each of the M memories include $2^m$ entries. Each of the entries contains P pairs of programmable {key, data}.

The tile device also includes a matching and selection logic configured to receive an input key and output a lookup result. The matching and selection logic includes a matching block configured to determine whether the input key matches any of the pre-programmed keys in the M memories, and a selection block configured to select a memory from those memories of the M memories that contain the pre-programmed keys matching with the input key. The selected memory has a lowest Mem ID among those memories. The lookup result includes pre-programmed data paired with the pre-programmed key. The lookup result also includes Mem ID and memory address where the pre-programmed data is stored.

In some embodiments, the lookup result is forwarded to an output reconfiguration interconnection fabric. The output reconfiguration interconnection fabric is configured to connect each of the T tiles to one of N final output selection devices for N lookup paths. In some embodiments, each of the N final output selection devices includes a collecting block configured to receive lookup results from all tiles reserved that a respective lookup path, and a selection block configured to select one final lookup result from all lookup results collected by the collecting block, wherein the selected final lookup result is from a hit tile having the lowest Tile ID. The selected final lookup result includes hit data, Tile ID, Mem ID and memory address where the hit data is stored.

Figure 1:
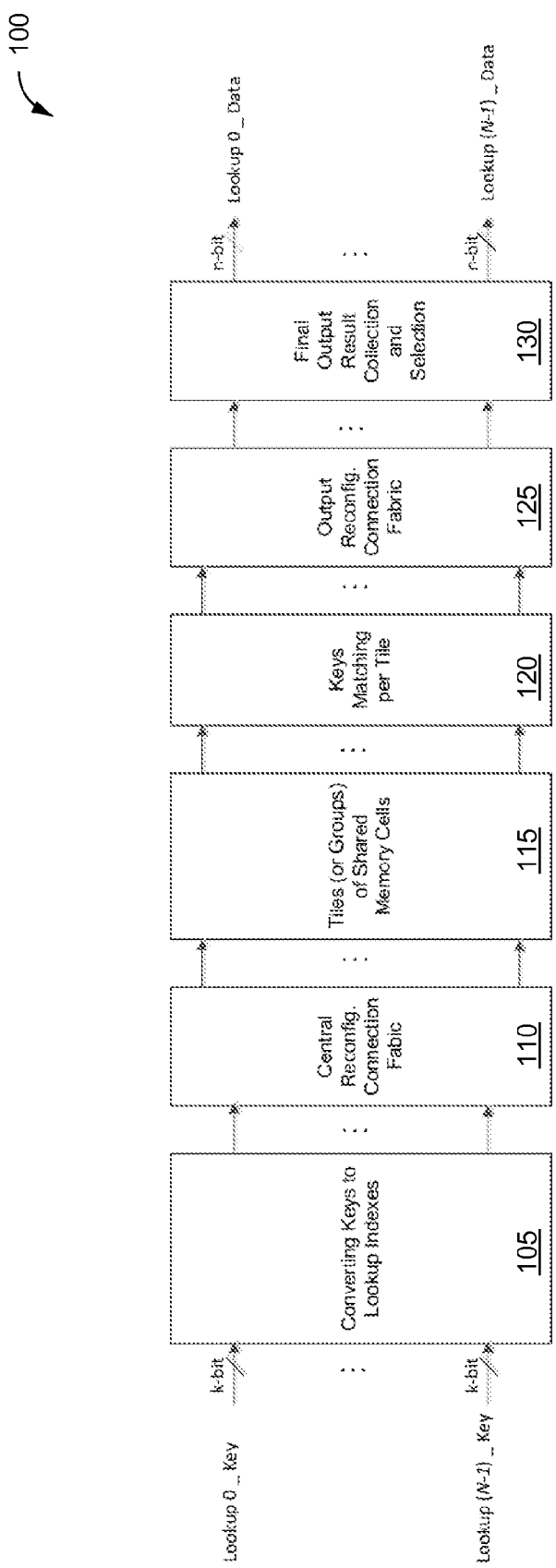
FIG. 1 illustrates a parallel lookup system according to an embodiment of the present invention.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

A system on-chip supports multiple parallel lookups that share a pool of memories. The number of memories reserved for each lookup is reconfigurable based on the memory capacity needed by that lookup. In addition, each lookup can be configured to perform as a hash-based lookup or direct-access lookup. The shared memories are grouped into homogeneous tiles. Each lookup is allocated a set of tiles. The tiles in the set are not shared with other sets such that all lookups are able to be performed in parallel without collision. The system also includes reconfigurable connection networks which are programmed based on how the tiles are allocated for each lookup.

FIG. 1 illustrates a parallel lookup system 100 according to an embodiment of the present invention. The system 100 is configured for N simultaneous or parallel lookup paths, without collision, using a plurality of shared memories. The system 100 returns n-bit data for each k-bit input key per lookup path. The system 100 includes blocks 105-130, each of which is first generally discussed prior to a detailed discussion of its respective features.

The pool of shared memories at the block 115 are grouped into T shared homogeneous tiles. Each tile contains M memories. Each lookup path is allocated a number of tiles from these T tiles. The tile allocation for each lookup path is typically reconfigurable by software.

At the block 105, an input key of each lookup path is converted to a plurality of lookup indexes. Information for reading lookup data, such as Tile IDs of respective tiles that the lookup path will access and addresses of memories in those tiles from which data will be read, become part of the lookup indexes.

The Tile IDs and the memory addresses of each input key are sent to their corresponding tiles though the block 110, which is a central reconfiguration interconnection fabric. The central reconfiguration interconnection fabric 110 includes a plurality of configurable central networks. These central networks are typically configured based on locations of the tiles that are reserved for the respective lookup path.

In each tile, at the block 120, pre-programmed keys and data are read from the memories at the addresses that had been previously converted from the corresponding input key (e.g., conversion at the block 110). These pre-programmed keys located in the memories are compared to the input key for the respective lookup path. If there is any match among these pre-programmed keys with the input key, then the tile returns a hit data and a hit address.

The hit information of each tile is collected by the respective lookup path which owns that tile through the block 125, which is an output reconfigurable interconnection network. Each lookup path performs another round of selection among the hit information of all tiles it owns at the block 130 before a final lookup result is returned for that lookup path.

Figure 2:
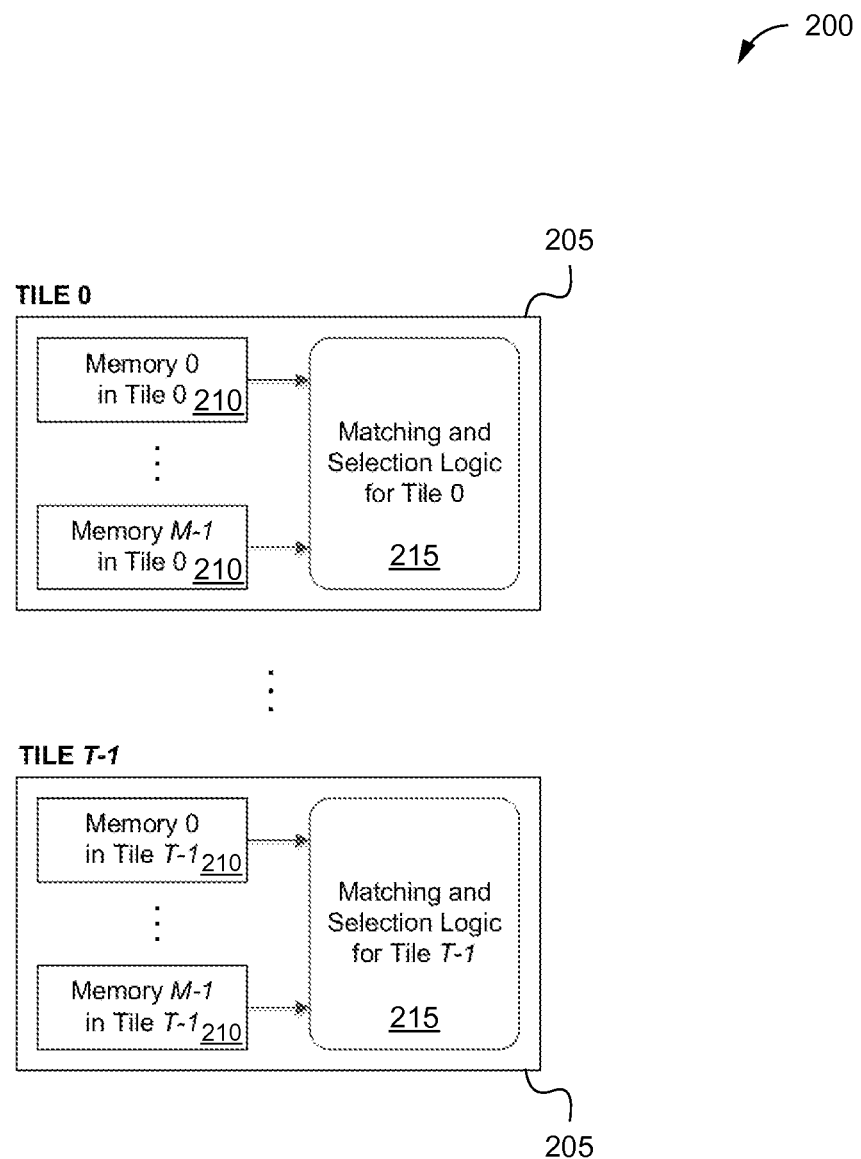
FIG. 2 illustrates a diagram of an exemplary grouping of shared memories according to an embodiment of the present invention.

FIG. 2 illustrates a diagram of an exemplary grouping of shared memories 200 according to an embodiment of the present invention. The diagram shows an organization of the shared memories in a parallel lookup system, such as the parallel lookup system 100 of FIG. 1, using tiles 205. The shared memories are grouped into T shared homogeneous tiles 205. Each tile 205 contains M memories for supporting D-LEFT lookups with M ways at block 215. Accordingly, the parallel lookup system 100 has a total of T×M memories. Each tile 205 has a Tile ID for identifying a tile in the parallel lookup system 100. The memories 210 inside each tile 205 are associated with Mem IDs, ranging from 0 to M−1, for identifying the memories 210 in that tile 205.

Before lookups are executed, each lookup path is allocated a set of consecutive tiles from the shared tiles. The number of tiles allocated for each lookup path is a power of 2 and depends on the memory capacity needed by that lookup path. No tile overlap between any two lookup paths is allowed. Assume in an exemplary scenario that the parallel lookup system 100 has eight tiles and four parallel lookup paths. The tile partitions for these lookup paths can be {8, 0, 0, 0} or {4, 4, 0, 0} or {4, 2, 2, 0} or {4, 2, 1, 1} or {2, 2, 2, 2} or any permutation of one of these partitions. This exemplary scenario will be continually referred to and built upon to illustrate the parallel lookup system 100.

Figure 3:
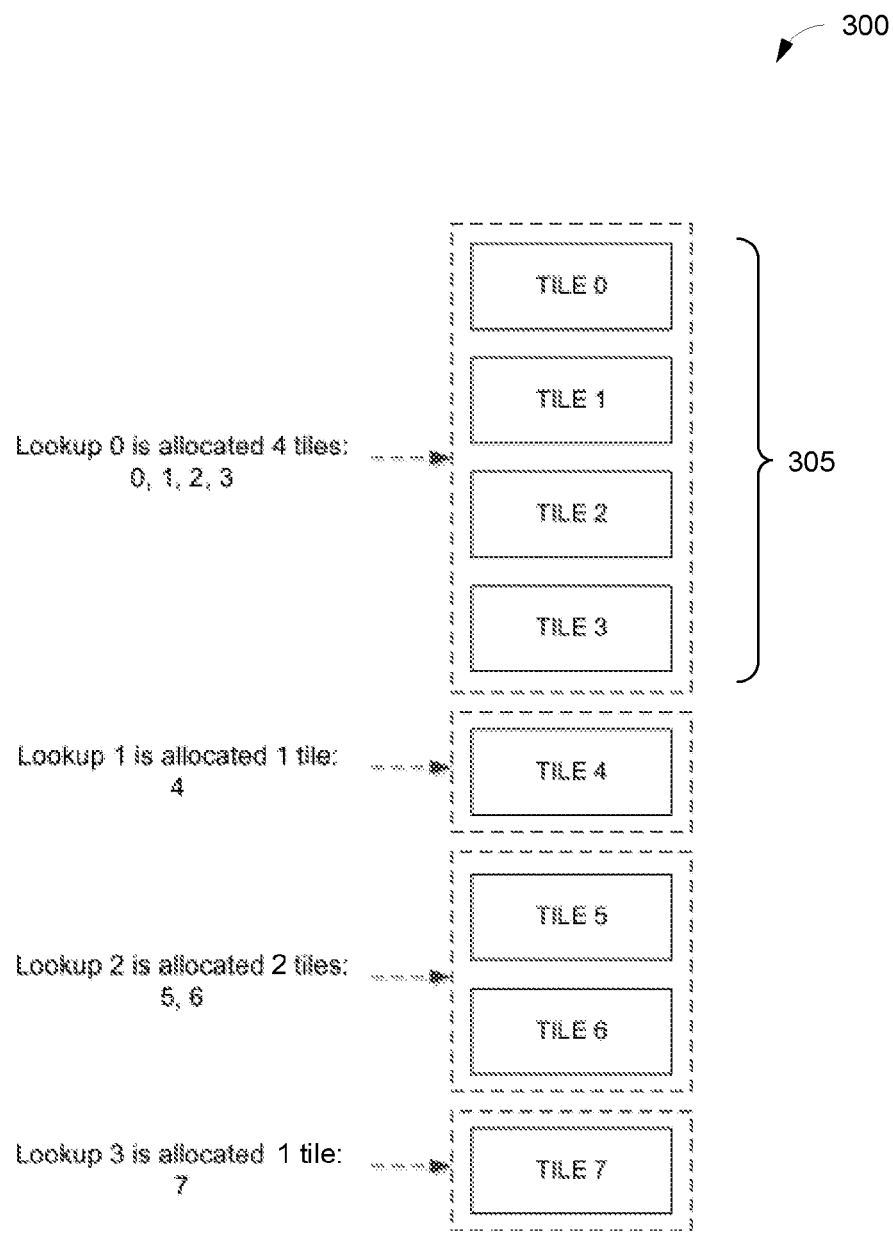
FIG. 3 illustrates a diagram of an exemplary allocation of shared tiles for lookup paths according to an embodiment of the present invention.

FIG. 3 illustrates a diagram of an exemplary allocation of shared tiles for lookup paths 300 according to an embodiment of the present invention. Continuing with the exemplary scenario of the parallel lookup system 100 with eight tiles and four parallel lookup paths, the eight tiles are partitioned 305 as follows: {4, 1, 2, 1}. Based on this partitioning example, Lookup Path 0 is allocated four tiles (particularly, Tiles 0, 1, 2 and 3), Lookup Path 1 is allocated one tile (particularly, Tile 4), Lookup Path 2 is allocated two tiles (particularly, Tiles 5 and 6) and Lookup Path 3 is allocated one tile (particularly, Tile 7).

After allocating a set or group of tiles for each lookup path, the input key for each lookup path is converted to a plurality of lookup indexes at the block 105 of FIG. 1. The lookup indexes are used to access the allocated tiles for the respective lookup path. Each lookup index for each key has $\log_2(T)+m$ bits. The $\log_2(T)$ most significant bits (MSBs) of the lookup index are used for Tile ID, and the m least significant bits (LSBs) of the lookup index are used for memory read address. The Tile ID points to one of the allocated tiles for the corresponding lookup path, while the memory read address is the address of a memory inside that tile from which data is read. Continuing with the exemplary scenario of the parallel lookup system 100 with eight tiles and four parallel lookup paths, assume each memory in each tile is 1K-entries wide. Since each Tile ID is 3-bits wide and each memory read address is 10-bits wide, then each lookup index is 13-bits wide.

Figure 4:
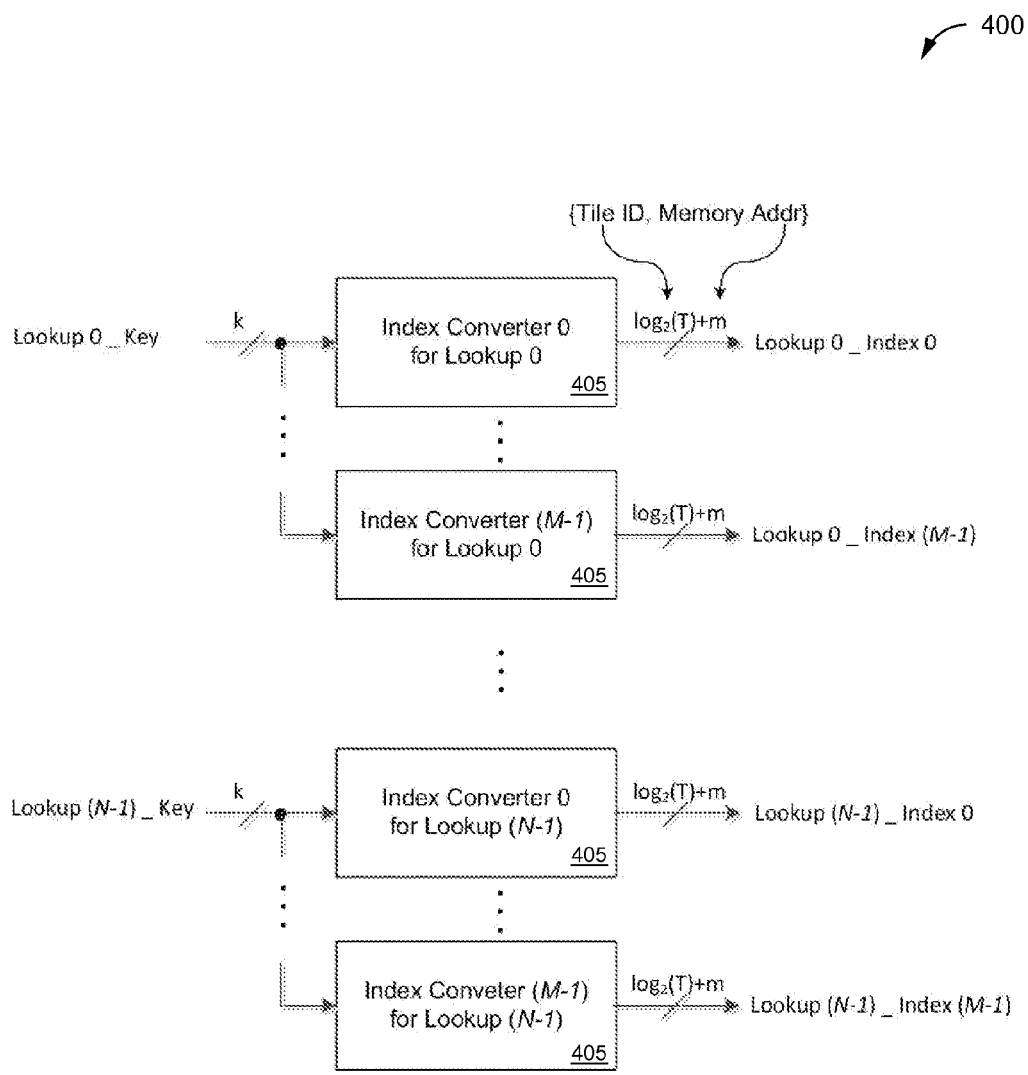
FIG. 4 illustrates an key-to-lookup indexes converter according to an embodiment of the present invention.

Each lookup path is typically equipped the same number of index converters as there are memories in a tile (i.e., M). FIG. 4 illustrates a key-to-lookup indexes converter 400 according to an embodiment of the present invention. In some embodiments, the block 105 of FIG. 1 is similarly configured as the key-to-lookup indexes converter 400. Each input key of per lookup path is sent to all of its M index converters 405. As a result, M lookup indexes are obtained for each input key per lookup path. Each lookup index can access any tile in the allocated tiles for the corresponding lookup path by using the value of the Tile ID, but lookup index i can only access memory i in that tile, which is further discussed below.

Each index converter 405 includes a set of hash functions. If a parallel lookup system has T tiles, then each index converter 405 has $\log_2(T)+1$ hash functions. Outputs of these hash functions have bitwidths ranging from m bits to $\log_2(T)+m$ bits. Hash size refers to the bitwidth of a hash function. The hash size selected for each lookup path is reconfigurable based on the number of tiles are reserved for that lookup path. If a lookup path is allocated q tiles, then the selected hash size for each index converter for that lookup path is $m+\log_2(q)$. Continuing with exemplary scenario of the parallel lookup system 100 with eight tiles, each index converter has $\log_2(8)+1=4$ (four) hash functions.

Figure 5:
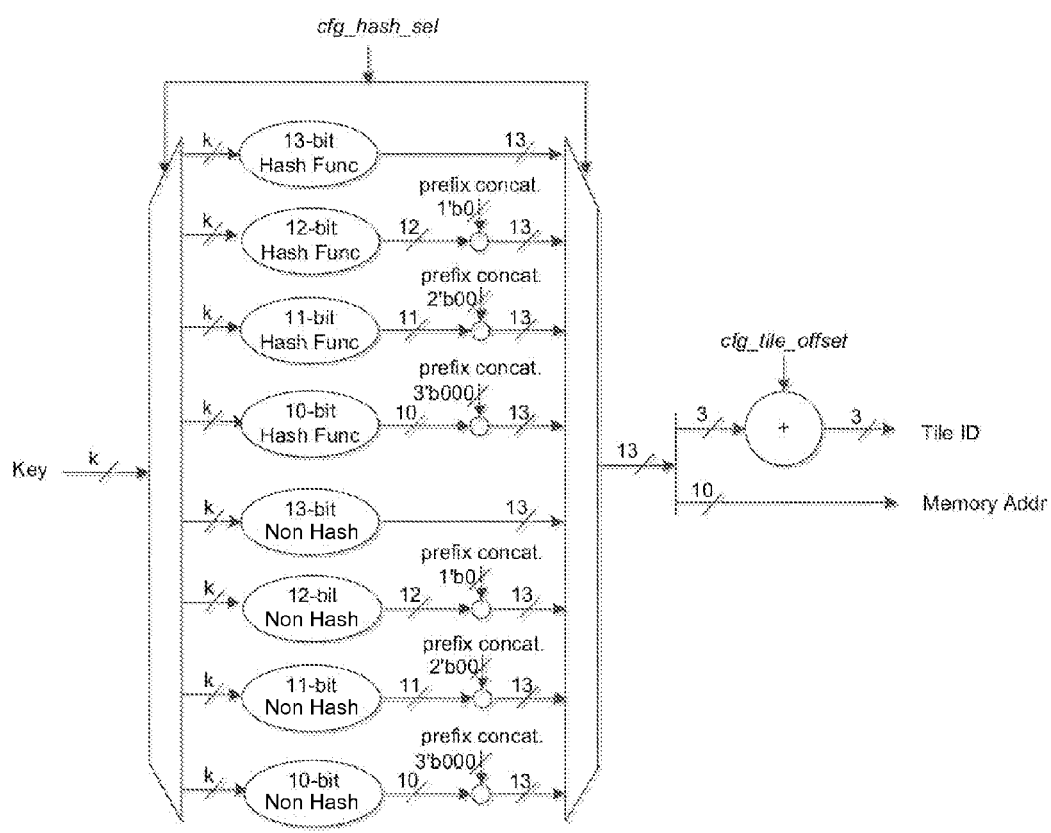
FIG. 5 illustrates an index converter according to an embodiment of the present invention.

FIG. 5 illustrates an index converter 500 according to an embodiment of the present invention. In some embodiments, the index converter 405 of FIG. 4 is similarly configured as the index converter 500. Continuing again with the exemplary scenario, assume the memory address in each tile is 10-bits wide. The hash sizes of the four hash functions are 10, 11, 12 and 13, respectively, (10 to $\log_2(8)+10$) because the system in this exemplary scenario has eight tiles. Since the hash sizes are not identical, zero bits are concatenated at the prefix of the outputs of these four hash functions such that outputs are each 13-bits wide.

A reconfigurable cfg_hash_sel register can be used to select a hash function for each lookup path. In FIG. 5, if a lookup path is allocated one tile, then the 10-bit hash function is selected ($\log_2(1)+10=10$). If a lookup is allocated two tiles, then the 11-bit hash function is selected ($\log_2(2)+10=11$). If a lookup is allocated four tiles, then the 12-bit hash function is selected ($\log_2(4)+10=12$). If a lookup is allocated eight tiles, then the 13-bit hash function is selected ($\log_2(8)+10=13$).

Similarly, the cfg_hash_sel register can be used to select a non-hash function for each lookup path. In particular, the index converter 500 also includes a set of non-hash functions which have the same sizes as the hash functions. The non-hash functions have no logic inside them. Instead, the non-hash functions simply take the least significant bits (LSBs) from the input key. The non-hash functions are used when users need to directly access the memories (by using the input key as a direct memory pointer) rather through hashing. With this design, a system such as the parallel lookup system 100 of FIG. 1 is able to support both hash-based and direct-access lookups. Choosing hash-based or direct-access for a lookup is by configuring the cfg_hash_sel register. For example, if a lookup is allocated four tiles, then the cfg_hash_sel register selects either the 12-bit hash function for hash-based lookup or the 12-bit non-hash function for direct-access lookup.

The index converter 500 also includes a reconfigurable cfg_tile_offset register to adjust the Tile ID of each lookup index so that the lookup index correctly points to one of the tiles allocated to the respective lookup path. The value configured for the cfg_tile_offset register is typically the first Tile ID in the set of tiles allocated for the corresponding lookup. For example, in FIG. 3, the cfg_tile_offset register for Lookup Path 0 is configured to 0 because the tiles allocated for Lookup Path 0 are Tiles 0, 1, 2 and 3. Similarly, the cfg_tile_offset registers for Lookup Path 1, 2 and 3 are configured to 4, 5 and 7, respectively.

Returning to FIG. 1, the parallel lookup system 100 includes the central reconfigurable interconnection fabric 110. The central reconfigurable interconnection fabric 100 includes the same number of separate central networks as there are memories in a tile (i.e., M). Each of the central networks has the same number of input ports as there are lookup paths (i.e., N) and has the same number of output ports as there are tiles (i.e., T). Each of the central networks connects outputs of index converter i of all lookup paths to memory i in all tiles.

Figure 6:
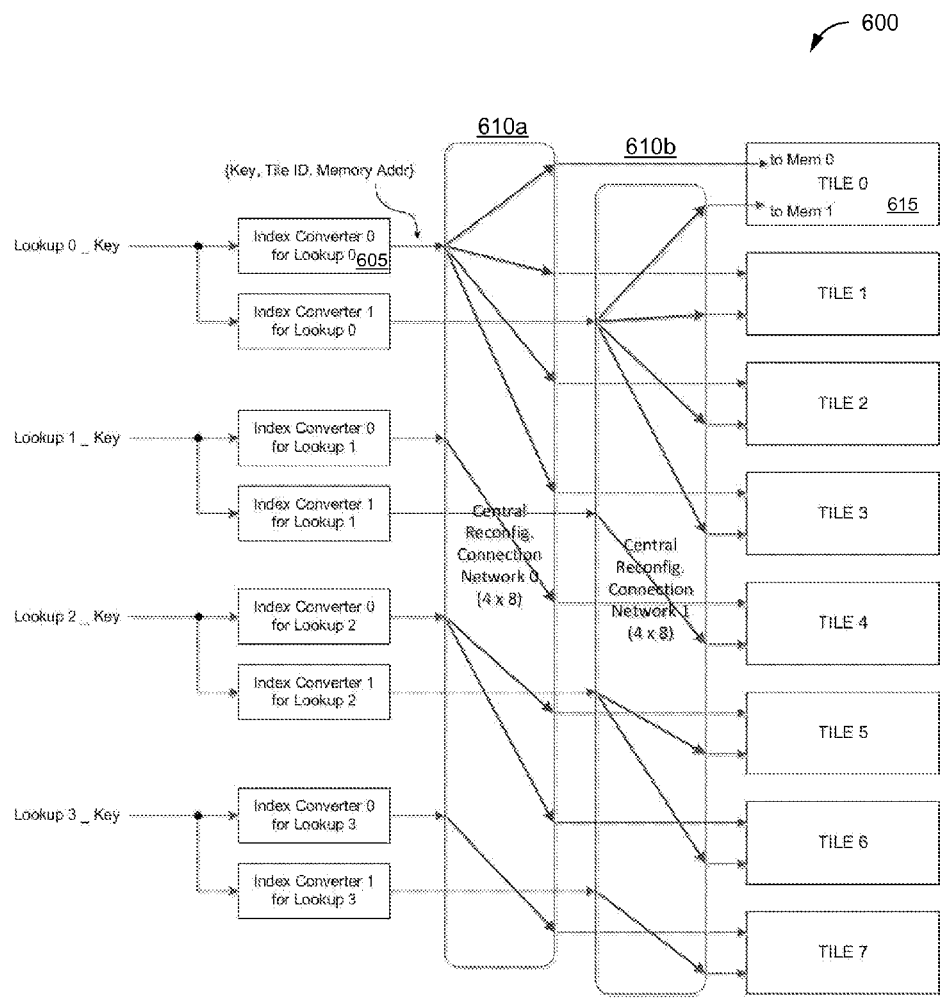
FIG. 6 illustrates a central reconfigurable interconnection fabric according to an embodiment of the present invention.

FIG. 6 illustrates a central reconfigurable interconnection fabric 600 according to an embodiment of the present invention. In some embodiments, the central reconfigurable interconnection fabric 110 is similarly configured as the reconfigurable interconnection fabric 600. Continuing again with the exemplary scenario, there are four parallel lookup paths using eight tiles 615, with two memories per tile, and so two index converters 605 per lookup path. The central reconfigurable interconnection fabric 600 has two 4×8 central networks 610a, 610b (collectively 610). Network 0 connects the outputs of index converters 0 of all lookup paths to Memories 0 of all tiles 615, and Network 1 connects the outputs of index converters 1 of all lookup paths to Memories 1 of all tiles 615.

These central networks 610 are configured to correctly connect each lookup path to its reserved tiles 615. For example, in FIG. 3, Lookup 0 is allocated to Tiles 0, 1, 2 and 3. As such, Network 0 is configured to connect Input Port 0 to Output Ports 0, 1, 2, 3. Similarly, Input Port 1 is connected to Output Port 4. Similarly, Input Port 2 is connected to Output Ports 5 and 6. Similarly, Input Port 3 is connected to Output Port 7. These connections are shown in FIG. 6. All central networks 610 have the same configuration setup. As such, configuration of Network 1 is exactly the same as Network 0.

Each central network 610 can be a crossbar. However, these central networks 610 are typically preconfigured before the lookups are executed, which means they do not change during run-time. Alternatively, the central networks 610 can be built from butterfly networks, which are less expensive than crossbars. There are several common reconfigurable butterfly networks that can be implemented, such as a Clos network, a Benes network or an Omega network.

After the central networks 610 are configured, each lookup path directly sends its input key and the lookup indexes, which includes Tile IDs and memory addresses, of the input key to all its allocated tiles 615. Once an allocated tile 615 receives the lookup index, the allocated tile 615 checks whether the Tile ID of this lookup index actually points to it. If the Tile ID is that of the tile, then that tile will use the memory address in the lookup index to read from its corresponding memory. If the Tile ID is not that of the tile, then the received index is ignored.

When a tile 615 receives a lookup index which has the Tile ID pointing to it, this lookup index is called a valid index. Since each tile 615 has M memories, each tile 615 can receive up to M valid lookup indexes from the same key through M central networks. For example, in FIG. 6, each tile 615 can receive two valid indexes for its two local memories.

Figure 7:
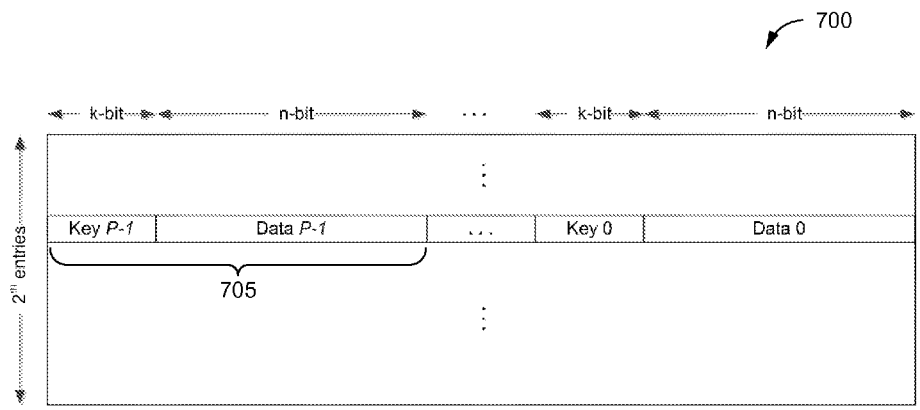
FIG. 7 illustrates a format of a memory inside a tile according to an embodiment of the present invention.

FIG. 7 illustrates a format of a memory 700 inside a tile according to an embodiment of the present invention. The depth of the memory 700 is typically $2^m$ entries (m-bit address). Each entry in the memory 700 contains P pairs 705 of pre-programmed {key, data} for supporting D-LEFT lookups with P buckets per way. Therefore, the width of the memory 700 is P×(k+n) bits, where k is the bitwidth of each key, and n is the bitwidth of each data. The values of keys and data in local memories of the tiles are programmable depending on how the shared tiles for each lookup path are partitioned and allocated. The program principle for these memories is based on a D-LEFT lookup technique.

When a tile receives a valid index for a local memory, the memory address in that valid index is used to read that local memory. Output of the local memory contains P pairs of pre-programmed {key, data} at the entry pointed by that memory address. In an extreme case where the tile receives M valid indexes for its M local memories, there are M×P pairs of {key, data}. The M×P keys are sent to a matching logic block inside that tile to decide which one(s) of these pre-programmed keys is/are matched with the input key. The matching result(s) is/are used to select a pre-programmed data to return as the lookup result of that tile.

Figure 8:
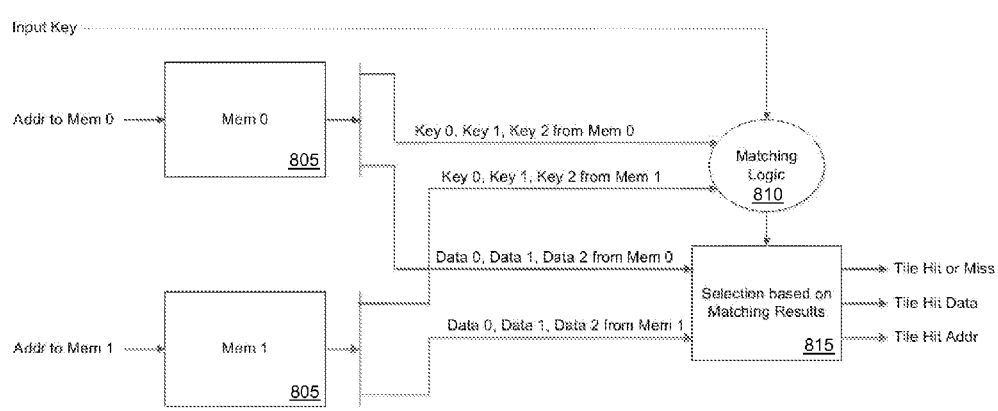
FIG. 8 illustrates a schematic of an exemplary tile according to an embodiment of the present invention.

FIG. 8 illustrates a schematic of an exemplary tile 800 according to an embodiment of the present invention. In some embodiments, the tiles in block 115 of FIG. 1 are similarly configured as the tile 800. Continuing again with the exemplary scenario, the tile 800 includes two memories 805, each with three pairs of pre-programmed {key, data}. For each input key, the tile 800 can obtain up to a maximum of six valid pairs of pre-programmed {key, data} from its two memories 805. The six or pre-programmed stored keys are sent to a matching block 810 of the tile 800. Matching result(s) from the matching block 810 is/are sent to a selecting block 815 to output a lookup result of the tile 800.

In some embodiments, the block 215 of FIG. 2 is similarly configured as the matching block 810 and the selecting block 815.

Figure 9:
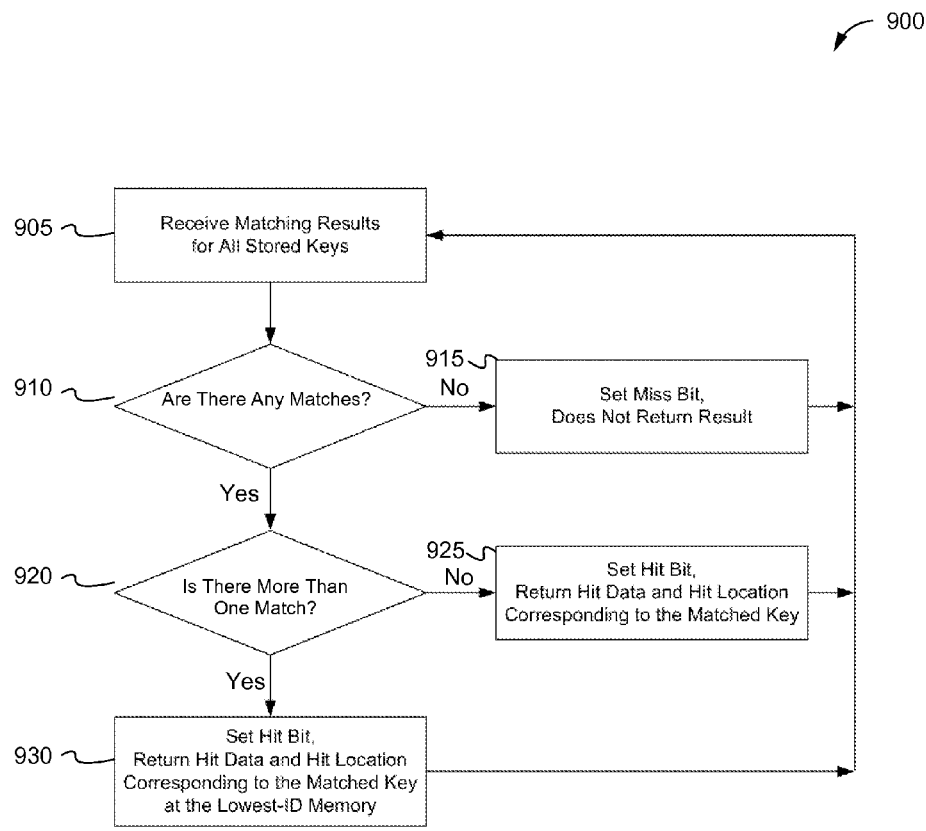
FIG. 9 illustrates a method of selecting a hit result in a selecting block according to an embodiment of the present invention.

FIG. 9 illustrates a method of selecting a hit result in a selecting block 900 according to an embodiment of the present invention. In some embodiments, the selecting block 815 of FIG. 8 is similarly configured as the selecting block 900. The method 900 begins at a step 905, wherein matching result(s) for all stored keys is/are received from the matching block 810 of FIG. 8. At a step 910, it is determined whether there are any matches among the pre-programmed or stored key matches with the input key. If no matches are determined at the step 910, then at a step 915, a miss bit is set and no results are returned. If at least one match is determined at the step 910, then at a step 920, it is determined whether there are more than one matches among the pre-programmed key matches with the input key. If only one match is determined at the step 920, then at a step 925, a hit bit is set and the pre-programmed data paired with the pre-programmed key is returned as hit data. If more than one match is determined at the step 920, then at a step 930, a hit bit is set and the pre-programmed data paired with the pre-programmed key in the memory that has lowest Mem ID is chosen and returned as hit data.

In addition to returning the hit data for the input key, the tile also returns the location of hit data which includes the memory ID and memory address where the hit data is stored. The location of hit data is useful for system debugging by users and also for statistical purposes. After the steps 915, 925 and 930, the method 900 returns to the step 905.

Referring back to FIG. 8, the lookup result of the tile 800 is sent to a result collector of each lookup path through an output reconfigurable interconnection fabric, such as the output reconfigurable interconnection fabric 125 of FIG. 1.

Figure 10:
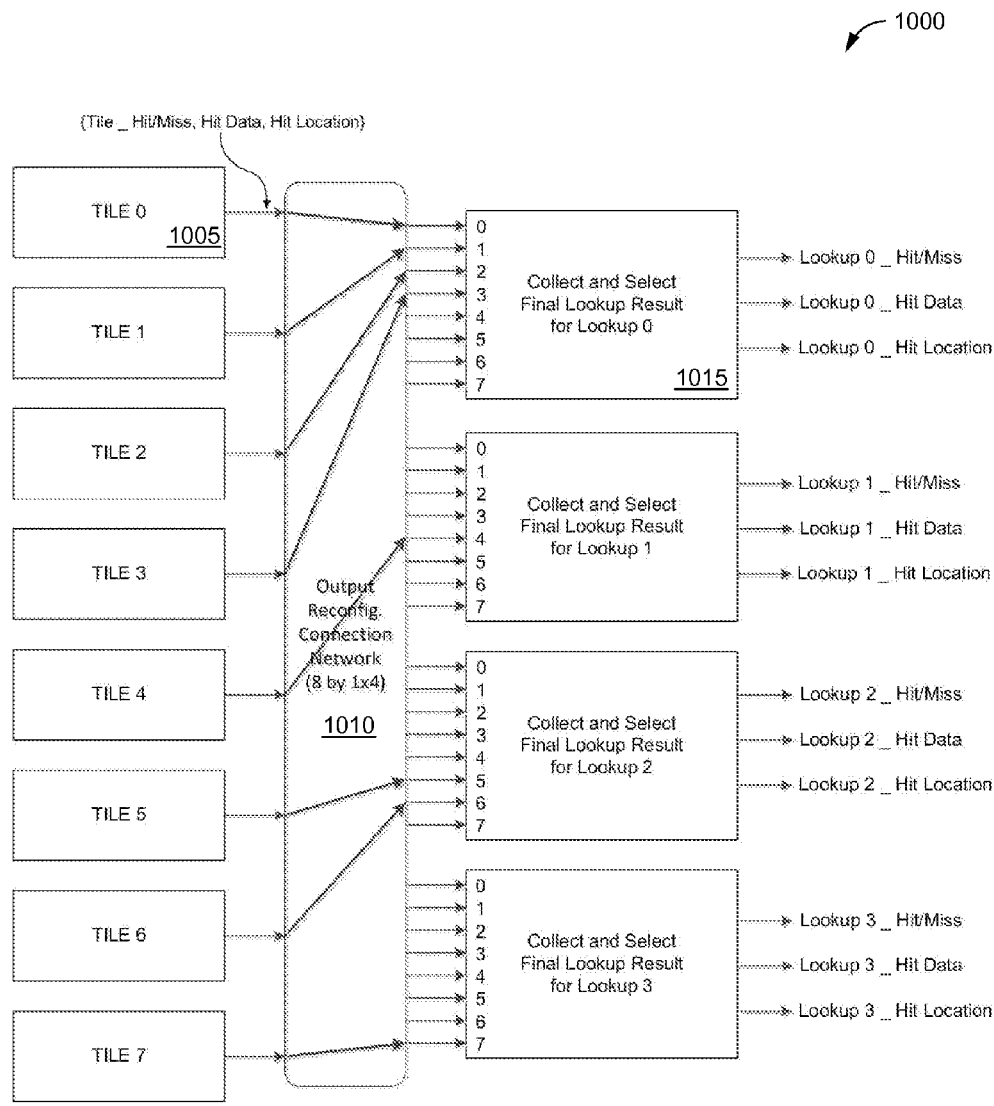
FIG. 10 illustrates an output reconfigurable interconnection fabric according to an embodiment of the present invention.

FIG. 10 illustrates an output reconfigurable interconnection fabric 1000 according to an embodiment of the present invention. In some embodiments, the output reconfigurable interconnection fabric 125 is similarly configured as the output reconfigurable interconnection fabric 1000. The output reconfigurable interconnection fabric 1000 includes an output network 1010. The output network 1010 includes T 1-input×N-output reconfigurable de-multiplexors. The output network 1010 connects an output of each of the tiles 1005 to an appropriate result collector 1015 of a lookup path. For example, in FIG. 3, the output network 1010 is configured to connect outputs of Tiles 0, 1, 2 and 3 to a result collector 1015 of Lookup Path 0. The output network 1010 is also configured to connect output of Tile 4 to a result collector 1015 of Lookup Path 1. The output network 1010 is also configured to connect outputs of Tiles 5 and 6 to a result collector 1015 of Lookup Path 2. The output network 1010 is also configured to connect output of Tile 7 to a result collector 1015 of Lookup Path 3. These connections are shown in FIG. 10. The result collector 1015 of each lookup path selects one result from the tiles 1005 it owns to output a final lookup result of that result collector 1015.

Figure 11:
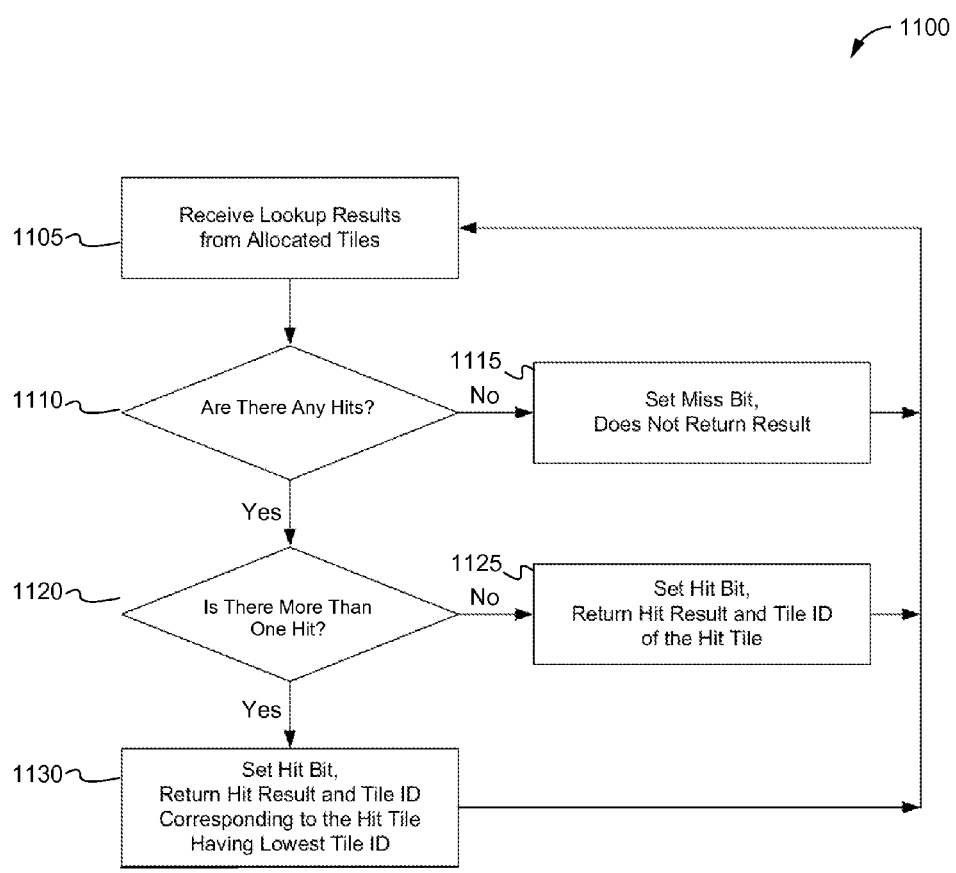
FIG. 11 illustrates a method of selecting a hit result in a results collector according to an embodiment of the present invention.

FIG. 11 illustrates a method of selecting a hit result in a results collector 1100 according to an embodiment of the present invention. In some embodiments, the results collector 1015 of FIG. 10 is similarly configured as the results collector 1100. The method 1100 begins at a step 1105, wherein lookup result(s) from allocated tiles is/are received. At a step 1110, it is determined whether there are any tile hits. If no hits are determined at the step 1110, then at a step 1115, a miss bit is set and no results are returned. If at least one hit is determined at the step 1110, then at a step 1120, it is determined whether there are more than one hits from the tiles. If only one hit is determined at the step 1120, then at a step 1125, a hit bit is set and the hit result or hit data is returned as a lookup result. If more than one hit is determined at the step 1120, then at a step 1130, a hit bit is set and the hit result from the tile having lowest Tile ID among tile hits is chosen and returned as a lookup result.

In addition to returning the hit result, the results collector also returns the Tile ID, memory ID and memory address where the hit data is read. The Tile ID, memory ID and memory address are useful for system debugging by users and also for statistical purposes. After the steps 1115, 1125 and 1130, the method 1100 returns to the step 1105.

Figure 12:
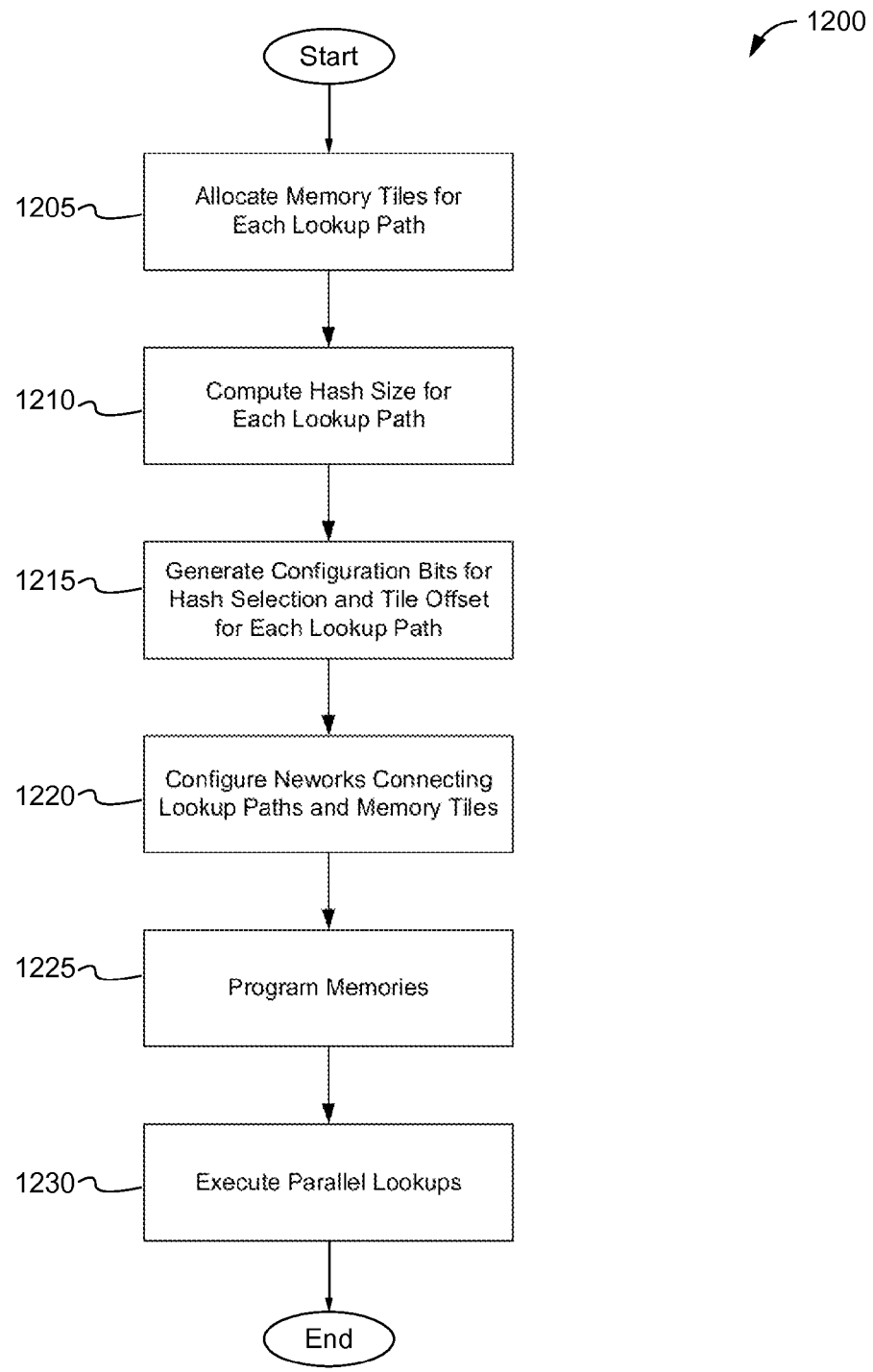
FIG. 12 illustrates a method of configuring and programming a parallel lookup system according to an embodiment of the present invention.

FIG. 12 illustrates a method of configuring and programming a parallel lookup system 1200 according to an embodiment of the present invention. The method 1200 provides a guideline for users to set up the parallel lookup system, such as the parallel lookup system 100 of FIG. 1. The parallel lookup system 100 has N parallel lookup paths with T shared tiles. Each tile has M memories. Each memory has a memory address m-bit wide. Each memory entry contains P pairs of {key, data} which are programmable by software. Each lookup in the system 100 is a D-LEFT lookup with M ways and P buckets per way.

The method 1200 begins at a step 1205, where a user allocates tiles for each lookup path. The number of tiles allocated to each lookup path must be a power of 2. The tile partition also must guarantee that there is no tile overlap among lookup paths.

At a step 1210, hash size of each lookup path is computed. The hash size for each lookup path is based on the number of tiles allocated for that lookup path. If a lookup path is allocated q tiles, then its hash size is equal to $\log_2(q)+m$.

After the hash size of each lookup is known, at a step 1215, registers cfg_hash_sel and cfg_tile_offset in the index converters are configured accordingly. The cfg_hash_sel register selects a function for the lookup path. The cfg_tile_offset register adjusts the Tile ID of a lookup index for the lookup path.

Meanwhile, at a step 1220, central and output interconnect networks are configured to connect the lookup paths with their reserved tiles. All configuration bits for index converters and networks can be automatically generated by a script according to the principles described herein.

At a step 1225, the memories allocated for each lookup path are programmed. Programming technique is based on a D-LEFT lookup technique with M ways per lookup and P buckets per way.

After all allocated memories are programmed, at a step 1230, the parallel lookup system 100 is ready to receive input keys and execute N lookups in parallel. After the step 1230, the method 1200 ends.

Embodiments of the present invention relate to multiple parallel lookups using a pool of shared memories by proper configuration of interconnection networks. The number of shared memories reserved for each lookup is reconfigurable based on the memory capacity needed by that lookup. The shared memories are grouped into homogeneous tiles. Each lookup is allocated a set of tiles based on the memory capacity needed by that lookup. The tiles allocated for each lookup do not overlap with other lookups such that all lookups can be performed in parallel without collision. Each lookup is reconfigurable to be either hash-based or direct-access. The interconnection networks are programmed based on how the tiles are allocated for each lookup.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A system on-chip configured to support N parallel lookups using a pool of shared memories, the system on-chip comprising:
   a pool of T×M shared memories are grouped into T tiles;
   M index converters for each of N lookup paths;
   a central reconfigurable interconnect fabric for connecting N input ports to the T tiles;
   an output reconfigurable interconnect fabric for connecting the T tiles to N output ports; and
   N output result collectors, wherein each of the N output result collectors is per one lookup path, wherein the system on-chip is configured to perform N parallel lookups against the pool of T×M shared memories along the N lookup paths, wherein N, T and M are positive integer values.

2. The system on-chip of claim 1, wherein the T tiles are partitioned and allocated for the lookup paths based on memory capacity needed by each of the lookup paths.

3. The system on-chip of claim 1, wherein a number of tiles allocated for each lookup path of the N lookup paths is a power of 2, and a tile cannot overlap among partitions.

4. The system on-chip of claim 1, wherein each lookup path is configurable to be a hash-based lookup or a direct-access lookup.

5. The system on-chip of claim 1, wherein index converter i of M index converters of each lookup path of the N lookup paths is used to access memory i in one of the T tiles allocated for that lookup path.

6. The system on-chip of claim 1, wherein each of M index converters of each lookup path of the N lookup paths is configurable based on a number of tiles allocated for that lookup path of the N lookup paths.

7. The system on-chip of claim 1, wherein the central reconfigurable interconnect fabric includes M configurable N×T networks.

8. The system on-chip of claim 1, wherein each of the N×T networks is one of a crossbar and a configurable butterfly.

9. The system on-chip of claim 1, wherein the output reconfigurable interconnect fabric includes T configurable 1×N de-multiplexors.

10. The system on-chip of claim 1, wherein one of N output result collectors associated with a lookup path of the N lookup paths is configured to collect results from allocated tiles for the lookup path and is configured to select one final result from results outputted by the allocated tiles.

11. The system on-chip of claim 1, wherein a hit result for each of the T tiles is based on key matching results between pre-programmed keys in memories of that tile and an input key of that tile.

12. A system on-chip configured to support N parallel lookups using a pool of shared memories, the system on-chip comprising:
   T×M shared memories are grouped into T tiles;
   M index converters for each lookup path;
   a central reconfigurable interconnect fabric for connecting N input ports to the T tiles;
   an output reconfigurable interconnect fabric for connecting the T tiles to N output ports; and
   N output result collectors, wherein each of the N output result collectors is per one lookup path, wherein each of the T tiles includes:
   M memories for supporting D-LEFT lookups with M ways per lookup;
   a matching block for comparing pre-programmed keys in the M memories with an input key; and
   a selection block for selecting a hit result for that tile, wherein N, T and M are positive integer values.

13. A system on-chip configured to support N parallel lookups using a pool of shared memories, the system on-chip comprising:
   T×M shared memories are grouped into T tiles;
   M index converters for each lookup path;
   a central reconfigurable interconnect fabric for connecting N input ports to the T tiles;
   an output reconfigurable interconnect fabric for connecting the T tiles to N output ports; and
   N output result collectors, wherein each of the N output result collectors is per one lookup path, wherein each of the shared memories has $2^m$ entries, wherein each of the entries contains P pairs of programmable {key, data} for supporting D-LEFT lookups with P buckets per way, wherein P, N, T and M are positive integer values.

14. A system on-chip configured to support N parallel lookups using a pool of shared memories, the system on-chip comprising:
   T×M shared memories are grouped into T tiles;
   M index converters for each lookup path;
   a central reconfigurable interconnect fabric for connecting N input ports to the T tiles;
   an output reconfigurable interconnect fabric for connecting the T tiles to N output ports; and
   N output result collectors, wherein each of the N output result collectors is per one lookup path, wherein each of M index converters of each lookup path further comprises:
   $\log_2(T)+1$ hash functions and $\log_2(T)+1$ non-hash functions, wherein outputs of the functions have bitwidths ranging from m bits to $\log_2(T)+m$ bits;
   a first configurable register for selecting one of the functions; and
   a second configurable register for selecting a tile offset such that a lookup index points to a correct tile among allocated tiles of that lookup path, wherein the allocated tiles are selected from the T tiles, wherein m, N, T and M are positive integer values.

15. A system on-chip configured to support N parallel lookups using a pool of shared memories, the system on-chip comprising:
   T×M shared memories are grouped into T tiles;
   M index converters for each lookup path;
   a central reconfigurable interconnect fabric for connecting N input ports to the T tiles;
   an output reconfigurable interconnect fabric for connecting the T tiles to N output ports; and
   N output result collectors, wherein each of the N output result collectors is per one lookup path, wherein an output index of each of the M index converters has $\log_2(T)+m$ bits, wherein the $\log_2(T)$ most significant bits in the output index are used to point to one of the T tiles and the m last significant bits in the output index are used as a memory read address, wherein m, N, T and M are positive integer values.

* * * * *